United States Patent [19]
Stankus et al.

[11] Patent Number: 6,150,190
[45] Date of Patent: Nov. 21, 2000

[54] METHOD OF FORMATION OF BURIED MIRROR SEMICONDUCTIVE DEVICE

[75] Inventors: John J. Stankus, Austin; Burt Wayne Fowler, Mountain City, both of Tex.

[73] Assignee: Motorola Inc., Schumburg, Ill.

[21] Appl. No.: 09/320,866

[22] Filed: May 27, 1999

[51] Int. Cl.$^7$ .................................................. H01L 21/00
[52] U.S. Cl. ............................................................ 438/72
[58] Field of Search ............................ 438/29, 31, 32, 438/42, 44, 72; 372/45, 99; 257/13, 98, 436

[56] References Cited

U.S. PATENT DOCUMENTS 5,828,088   10/1998   Mauk ........................................ 257/98

OTHER PUBLICATIONS

G. Neudeck et al., "Selective Epitaxial Growth Si Resonant–Cavity Photodetector", IEEE Photonics Technology Letters, vol. 10, No. 1, pp. 129–131, Jan. 1998.

Peter J. Schubert et al., "Confined Lateral Selective Epitaxial Growth of Silicon for Device Fabrication", May 1990 IEEE Electron Device Letters, vol. 11, No. 5, pp. 181–183.

M. Edward Motamedi et al., "Micro–Optics/Micromechanics and Laser Scanning and Shaping", SPIE (The Society of Photo–Optical Instrumentation Engineers), vol. 2383, pp. 146–153.

James J. Pak et al., "A bridge–type piezoresistive accelerometer using merged epitaxial lateral overgrowth for thin silicon beam formation", Elsevier Science S.A., Sensors and Actuators A 56 (1996), pp. 267–271.

J.W. Siekkinen et al., "A Novel High–Speed Silicon Bipolar Transistor Utilizing SEG and CLSEG", May 1994 IEEE Transactions on Electron Devices, vol. 41, No. 5, pp. 862–864.

Gerold W. Neudeck et al., "Stacking Fault Reduction in Silicon–on–Insulator (SOI) Islands Produced by Selective Epataxial Growth (SEG) of Silicon Using a Thermally Nitrided SiO2 Field Insulator", Elsevier Science B.V. Microelectronic Engineering 36 (1997, pp. 391–394.

Srikanth B. Samavedam et al., "Defect Structures in Silicon Merged Epitaxial Lateral Overgrowth", Journal of Electronic Materials, vol. 24, No. 11, 1995, pp. 1747–1751.

Gerold W. Neudeck et al., "Selective Epataxial Growth Si Resonant–Cavity Photodetector", 1998 IEEE Photonics Technology Letters, vol. 10, No. 1, Jan. 1998, pp. 129–131.

*Primary Examiner*—Charles Bowers
*Assistant Examiner*—Keith Christianson
*Attorney, Agent, or Firm*—Keith E. Witek

[57] ABSTRACT

A method for forming a buried optical mirror in an integrated circuit (IC) begins by forming an opening (18) within a substrate (12). The opening (18) is then filled with a plurality of dielectric layers (20–26) that have different indexes of refraction whereby a Bragg reflector can be formed. A chemical mechanical polishing (CMP) process is then used to planarize the layers (20–26) such that these layers (20–26) only reside within the opening (18) whereby a mirror is formed. Lateral selective epitaxial growth, polysilicon deposition and recrystallization, or wafer bonding is then used to form a single crystalline or near single crystalline semiconductive material (32b) over a top of the substrate (12) and the reflecting mirror. Photodevice(s) are then formed over the mirror in the region (28) of material (32b) whereby reflecting mirror (20–26) will improve the quantum efficiency and speed of the photodevice(s).

22 Claims, 6 Drawing Sheets

METHOD OF FORMATION OF BURIED MIRROR SEMICONDUCTIVE DEVICE

FIELD OF THE INVENTION

The present invention relates generally to integrated circuit IC) manufacture, and more particularly to, forming a buried mirror under an active device on a semiconductor substrate to improve quantum efficiency of overlying photodevices.

BACKGROUND OF THE INVENTION

In the integrated circuit (IC) industry, buried reflective mirrors are being researched for embedded use under integrated circuit (IC) semiconductive photodevices. In a first prior art embodiment, a dielectric reflector is formed on top of a semiconductor substrate and lithographically patterned and etched. After the mirror is lithographically patterned to create exposed sidewalls of the mirror, exposed portions of the substrate adjacent the sidewalls are epitaxially grown vertically upwards along the sidewall of the reflective mirror. After a significant period of time the vertical epitaxial growth will extend the substrate material up to a top surface of the previously patterned mirror. If growth continues from this point, lateral epitaxial growth begins to occur over a top surface of the patterned mirror. Eventually, after a very long epitaxial growth time, the entire top surface of the patterned reflective layers are completely covered with epitaxial silicon. In summary for this process, vertical epitaxial growth is followed by horizontal epitaxial growth in order to entirely encapsulate the mirror in semiconductive material.

It is important to note that these devices that utilize extensive vertical epitaxial growth as well as extensive lateral epitaxial growth are nonoptimal. First, vertical and horizontal epitaxial growth will increase the distance the epitaxial material must travel and forces epitaxial materials to turn corners during growth at right angles whereby silicon defectivity and epitaxial faceting is highly likely. In addition, the extensive time period needed for such epitaxial growth will reduce throughput through a fabrication facility whereby the cost of these devices will increase. Therefore, for high performance, high yield, low cost, and optimal devices, these types of vertically and horizontally epitaxially encapsulated reflective devices are not optimal.

In conjunction with the above method, the industry has begun to experiment with reflectors made entirely of metal where such metallic materials are located below the epitaxially grown semiconductive regions. While metallic reflective regions may be utilized as reflector devices, metallic reflectors are generally less efficient than a dielectric mirror or a combination of a dielectric and metallic reflector. In addition, there is no known method for forming composite metallic and dielectric reflectors without epitaxial growth or with reduced epitaxial processing whereby epitaxial defectivity and silicon faceting can be avoided.

Therefore, a need exists in the industry for an improved method of forming buried dielectric and composite dielectric/metallic reflective mirrors whereby silicon defectivity and faceting problems, as well as long time period and high temperature epitaxial processes, are reduced or avoided. In addition, it would be beneficial if the new process improved throughput and/or reduced wafer costs. In addition, these improved processes should allow for greater quantum efficiency, improved speed, and/or improved yield of the manufactured photoelectric devices.

Figure 1:
FIGS. 1–6 illustrate, in cross sectional diagrams, a method for forming an inlaid dielectric Bragg reflector that may be embedded underneath integrated circuit (IC) semiconductive photodevices.

It will be appreciated that for simplicity and clarity of illustration, elements illustrated in the drawings have not necessarily been drawn to scale. For example, the dimensions of some of the elements are exaggerated relative to other elements for clarity. Further, where considered appropriate, reference numerals have been repeated among the drawings to indicate corresponding or analogous elements.

DESCRIPTION OF A PREFERRED EMBODIMENT

Generally, the present invention is a method for forming a buried Bragg dielectric mirror stack or buried composite metallic and dielectric mirrored stack in an improved manner. Specifically, the methods taught herein teach the formation of a Bragg reflector or a metallic reflector within a semiconductor integrated circuit (IC) where the reflector is positioned underneath active photodevices. Generally, the methods taught herein will usually form the dielectric mirror stack or the metallic dielectric composite mirror along with overlying semiconductive material in a manner that results in one or more of reduced silicon defectivity, reduced faceting problems, increased throughput, improved performance, improved yield, improved quantum efficiency, and/or improved device speed over that available in the prior art.

The invention can be better understood with specific reference to FIGS. 1–16.

FIGS. 1–6 illustrate a first method which may be used to form a buried Bragg reflective structure under semiconductive IC devices. FIG. 1 specifically illustrates the first steps in the formation of a semiconductor device 10 containing a buried mirror structure. Formation of device 10 begins by providing a substrate 12. In a preferred embodiment, the wafer 12 is a single crystalline silicon wafer. However, in other embodiments, the wafer 12 may be a silicon germanium wafer, a gallium arsenide wafer, any III-V compound, silicon carbide, a silicon on insulator (SOI) wafer, epitaxial material, a dielectric wafer, such as sapphire, or any like semiconductive or integrated circuit (IC) starting material.

FIG. 1 illustrates that a pad oxide 14 is formed over the substrate 12. In one form, the pad oxide is a thermally grown silicon dioxide layer that is roughly 200–1000 Å in thickness. Generally, layer 14 is any layer of material that can protect the underlying substrate 12 during subsequent processing and/or protect overlying layers from contact with the substrate. Specifically, the layer 14 can be used to prevent stress related problems during manufacturing, and/or also may be used to prevent contamination from passing between the substrate 12 and subsequently-formed overlying material, such as photoresist. It is important to note that the layer 14 may be a material other than an oxide, and that the layer 14 may also be a composite dielectric layer such as oxide-nitride-oxide (ONO) or like dielectric composite layer.

After formation of the pad oxide 14, a photoresist layer 16 is formed over a top of the pad oxide 14. This photoresist layer 16 is selectively exposed to energy using conventional lithographic techniques that involve photoresist spinning operations, photoresist baking operations, photoresist masks, chemical development, and potentially other photoresist or lithographic operations. The photoresist 16 is chemically developed after selective or masked light exposure in order to form an opening through the photoresist as illustrated in FIG. 1. Various different post-bake resist operations, pre-bake resist operations, spin coat operations, chemical developing, lithographic exposure, and other lithographic and etch operations, in FIG. 1 may be used in FIG. 1.

Figure 2:
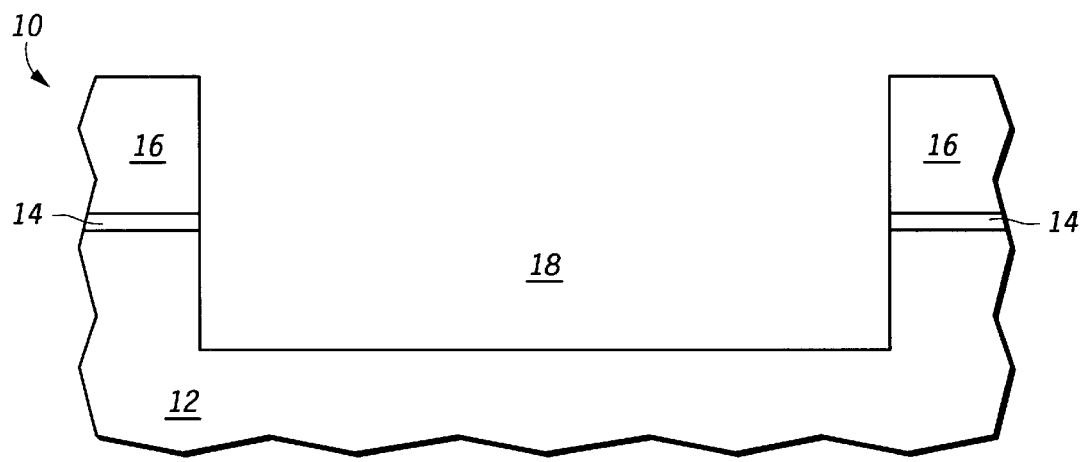

FIG. 2 illustrates that the device 10 is exposed to an etch environment which first etches all portions of the pad oxide 14 which are exposed within the opening in the photoresist 16. After etching exposed portions of the layer 14 to expose the substrate 12, then exposed portion of the substrate 12 is as illustrated in FIG. 2. Generally, the etch illustrated in FIG. 2 may be performed by a first selective etch that is used to etch the layer 14 followed by a second selective etch that is used to deepen the opening 18 into the substrate 12. However, a nonselective timed etch where the etch chemistry attacks both layer 14 and 12 indiscriminately or nearly equally may also be used in FIG. 2. Generally, the etch operation performed in FIG. 2 is performed by a reactive ion etch (RIE) process or a like plasma etch process. As will be evident in subsequent paragraph, it is advantageous for the opening 18 to have a substantially flat bottom surface in many of the embodiments taught herein. In order to obtain a very flat surface, it is desirable to etch the opening 18 using RIB or plasma processes since such processes typically result in smooth and planar bottom feature surface. It should be noted that in other embodiments, a non-planar bottom surface of the opening may be desired whereby wet etch processing may be utilized to alter the sidewall and bottom contour of the opening 18. As an example, a reflector that has a spherical, rounded, or parabolic surface is sometimes desired for various mirror applications. Such is possible with wet etch processing or a combination of wet, RIE, and/or plasma etch processing.

Figure 3:
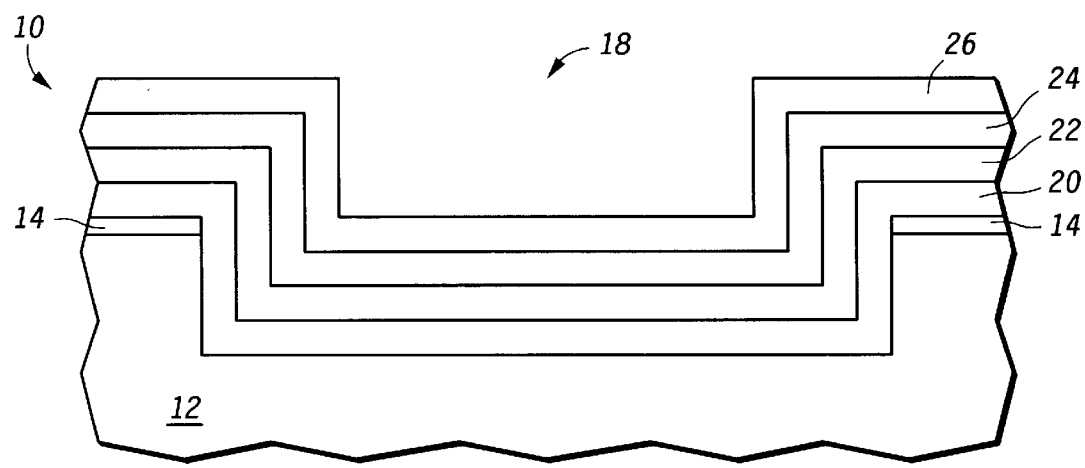

FIG. 3 illustrates that a plurality of dielectric layers 20–26 is sequentially deposited over a top of the structure 10 whereby the opening 18 is substantially filled by these layers 20–26. Specifically, FIG. 3 illustrates that dielectric layer 20 is first deposited by a chemical vapor deposition process (CVD). After deposition of this layer 20, a layer 22 is then deposited over the layer 20. As illustrated, a layer 24 is then deposited on the layer 22, and a layer 26 is then deposited on the layer 24 in a sequential manner. It is important to note that these layers 20–26 may be deposited in a batch deposition system or a multi-chamber system. In other embodiments, each or several of the layers 20–26 may be deposited in separate semiconductor tools located within in different physical areas of an IC fabrication facility.

The purpose of the dielectric layers 20–26 are to eventually form a dielectric mirror structure within the opening 18 of the substrate 12. Therefore, the dielectric layers 20–26 are chosen based upon their index of refraction. In addition, the layers 20–26 are configured in pairs so that the dielectric mirror has a proper number of dielectric interfaces to create a proper mirror structure. Generally, the material types are interleaved in the stack of layers 20–26 to create the required energy/light reflection. For example, layers 20 and 24 may be formed of a first type of material whereas the layers 22 and 26 may be formed of a second type of material having a different index of refraction. More specifically, one may form the layers 20 and 24 as a silicon dioxide layer whereas the layers 22 and 26 are formed as silicon nitride layers. However, it is important to note, that any interleaved combination of any two different materials may be used to form the dielectric stack 20–26 illustrated in FIG. 3. To this end, any combination of two or more dielectrics, semiconductive layers, or metallic structures may be used to form the mirror stack 20–26. Such material include, but are not limited to, polysilicon, amorphous silicon, thermal oxides, tetraethylorthosilicate (TEOS) glass, nitrides, metallic oxides, doped dielectric materials (e.g., BPSG, PSG), silicon rich silicon nitride, silicon oxynitride, or other materials which inherently have a different index of refraction when used in conjunction with each other.

It is important to note that epitaxial semiconductive growth will occur in subsequent steps of the process whereby the top most layer 26 is preferably a layer that is not a seed layer for epitaxial growth processing. In addition, the thickness of the layers 20–26 are constrained to specific thicknesses in order to form an effective Bragg mirror. Therefore, the thickness of the layers 20–26 are set such that the thickness is roughly equal to $(2N-1)\lambda/4$ where N is a finite positive integer (e.g., $(2N-1)/4 = \frac{1}{4}, \frac{3}{4}, \frac{5}{4} \ldots$) and $\lambda$ is the desired reflecting wavelength of interest within the layers of material 20–26. For example, if the desired reflection wavelength $\lambda$ is 700 nanometers (nm), a silicon dioxide layer having an index of refraction of 1.4 would be formed to a thickness of 125 nanometers in its thinnest embodiment.

Therefore, the depth of the opening 18 into the substrate 12 is a function of the type of materials selected to form the dielectric mirror stack in FIG. 3 and their optical properties. In addition, the depth of the opening 18 is a function of the number of layers of materials chosen (e.g., any number of layers greater than, or equal to, two may be chosen in the mirror structure), the wavelength $\lambda$ of the reflection desired, and the index of refraction (n) of the materials selected. Depending upon these parameters the depth of the opening 18 can be anywhere from a few hundred angstroms to several microns in depth into the substrate 12. However, the width of the opening 18 is generally not constrained by such parameters. The width of the opening 18 is generally decided by a designer whereby the width of opening 18 may be small (e.g., one micron in width) and support the operation of only a single photoelectronic device or may extend over substantially all of the area of an integrated circuit to accommodate many active devices (i.e., an array of photoelectric sensors) formed over an integrated circuit (IC) die.

Figure 4:
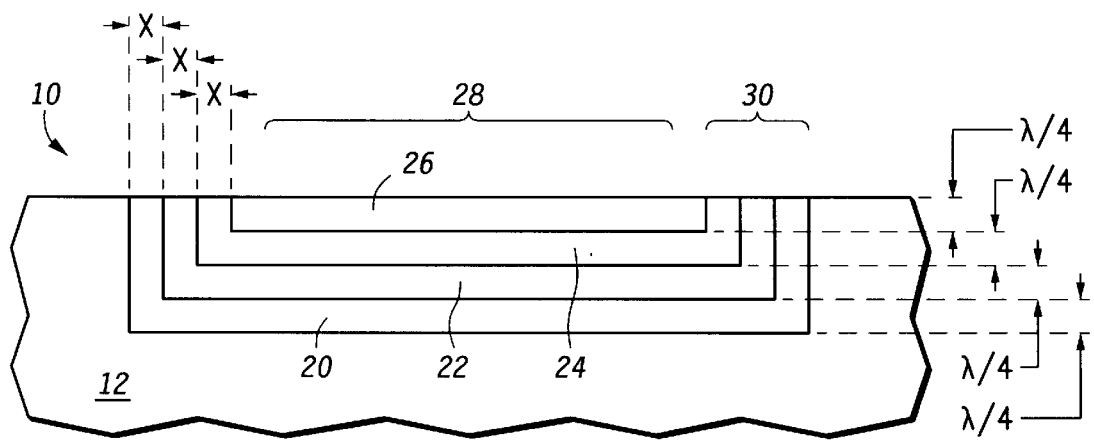

FIG. 4 illustrates that the layers 14, 20, 22, 24, and 26 are exposed to a planarization process. In a preferred form, the layers are chemically mechanically polished (CMP) by a dielectric polishing process which stops at or near a top surface of the semiconductor substrate 12. In other forms, resist etch back (REB) processing or a combination of chemical mechanical polishing (CMP) with a subsequent etch clearing step may be used to perform planarization in FIG. 4.

After the polishing in FIG. 4, the dielectric layers 20–26 have been polished to only reside in the opening 18 (or other opening formed on the same substrate) whereby one or more dielectric mirror stack structure has been formed on the IC. While FIG. 4 specifically illustrates a single mirror structure, it should be noted that two adjacent structures or up to millions of segmented or contiguous mirror regions may be formed in the substrate in any shape or configuration. The one illustrated dielectric mirror stack structure defines two IC areas 28 and 30 in FIG. 4. The area 28 is an active photo device area wherein all the interfaces between the layers 20–26 run substantially parallel to the top surface of the substrate 12 so that an effective Bragg reflective region is created. This is the area in which active devices may be formed overlying the mirrors whereby these devices will advantageously benefit from efficient reflection from layers 20–26. FIG. 4 also illustrates a peripheral area 30 of the mirror layers 20–26 which is an area over which photoelectric devices are not likely to benefit substantially (or at all) from reflection from the underlying mirror structure. Therefore, the regions 30 are typically used as interconnect and/or isolation regions as opposed to active areas that support overlying photoelectric devices. In an alternative, areas 30 may also support non-photoelectric devices such as CMOS transistors, bipolar transistors, diodes, logic devices, and/or the like.

FIG. 4 illustrates that the deposited thickness of the layers 20–26 along a bottom of the dielectric mirror stack structure are equal to a multiple of $\lambda/4$ the wavelength of interest ($\lambda$) through that film. However, the deposition thickness of the material 20–26 along a sidewall of the opening 18 need not be the same thickness as $\lambda/4$ or $(2N-1)\lambda/4$. Specifically, the sidewall thickness dimension X in FIG. 4 may be less than or substantially less than the thickness $(2N-1)\lambda/4$ of the material at the bottom of the opening 18. This difference in sidewall versus bottom thickness of the layers 20–26 can be accomplished by controlling various deposition conditions in the dielectric deposition chamber (i.e., pressure, electrical bias, etc.). It is advantageous if X is less than $\lambda/4$, since the limited-use area 30 of FIG. 4 is reduced in footprint whereas the more optimal active area 28 is increased in total percentage of die area. An increased percentage of area 28 is advantageous since it means the same size dielectric mirror stack of layers 20–26 can support a larger device or more numerous photodevices in the same surface area. In the alternative, a mirror with reduced dimensions X may support the same number of devices in less area that a material with greater sidewall thicknesses X. In other words, reducing X results in a larger percentage of the mirror being useful for Bragg reflection.

Figure 5:
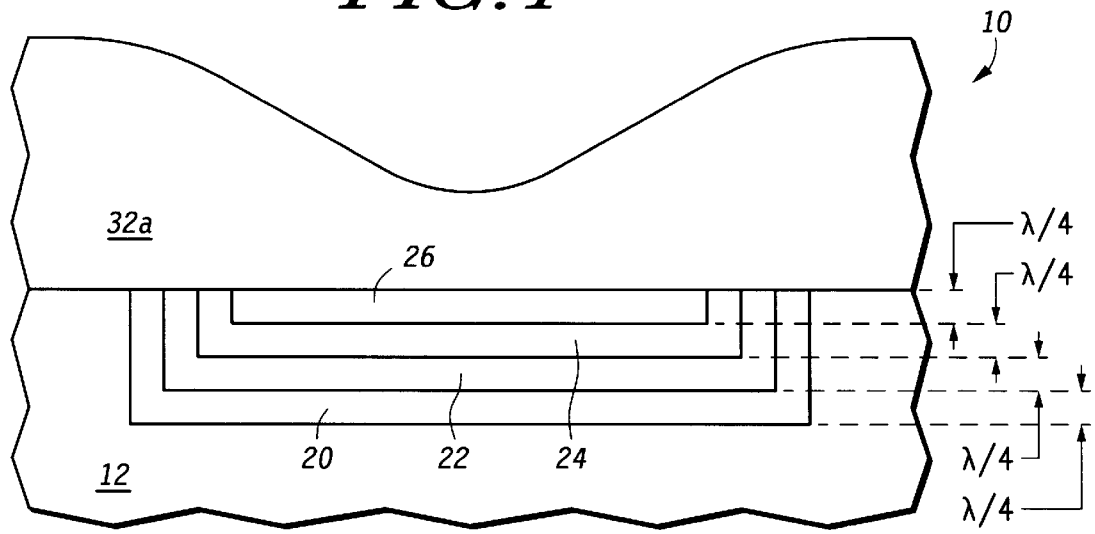

FIG. 5 illustrates that the polishing and/or etching operations illustrated in FIG. 4 will expose peripheral portions of the substrate 12 laterally adjacent the mirror structure 20–26. These one or more regions are preferably cleaned with a surface cleaning technique such as an RCA clean followed by a dip in hydrofluoric acid (HF). Once a clean surface is obtained, the substrate 12 is exposed to a selective epitaxial growth process which seeds semiconductive material from the exposed portions of substrate 12. The epitaxial process will not substantially seed material from a top of the exposed portions of the dielectric layers 20–26, such layers not being a seed for epitaxial growth in a preferred form. The epitaxial material grown from cleaned regions 12 will grow in vertical thickness and will also laterally or horizontally grow across a top of the layers 20–26 to form a sideways "hour glass shape". This sideways hour glass shape is referred to as an epitaxial region 32a in FIG. 5. This epitaxial region 32a can be any material which is selectively grown from substrate 12 that can also support active, passive, electronic, and/or photoelectric device formation. Such materials generally include silicon, silicon germanium, insitu doped silicon, polysilicon, germanium, gallium arsenide, other III–V compounds, silicon carbide, or a like substrate based material. Generally, epitaxial growth continues in FIG. 5 until the entire top surface of the exposed dielectric layers 20–26 is laterally encapsulated by some thickness of epitaxial material as shown. The regions 12 from which material is epitaxially grown may be small seed regions (e.g., one micron by one micron exposed regions) and/or large exposed areas of silicon that support CMOS transistors or like electrical or electromechanical devices later in the fabrication process.

It is important to note in FIG. 5 that the sidewalls of the mirror structure 20–26 directly abut silicon substrate material 12 which is made of high quality, single crystalline material. The material along the sidewalls of layers 20–26 is not epitaxial grown material whereby this material has much reduced silicon defectivity, reduced faceting problems, and improved reliability over vertically-grown epitaxial regions which occupy this space in the prior art. Due to the presence of single crystalline high quality substrate material near a top surface of the layers 20–26, the higher-temperature epitaxial growth need only progress laterally in FIG. 5 and need not progress vertically along a sidewall of the layers 20–26 as is the case in the prior art. Since the epitaxial growth need not progress around right hand corners in FIG. 5, since the epitaxial growth distance is reduced in overall epitaxial growth distance, and since high temperature processing times may be reduced, a higher quality epitaxial region with reduced defectivity and reduced facet deformation can be formed in a cost effective manner. Furthermore, throughput may be improved since less epitaxial growth time is required for the device of FIG. 5.

Figure 6:
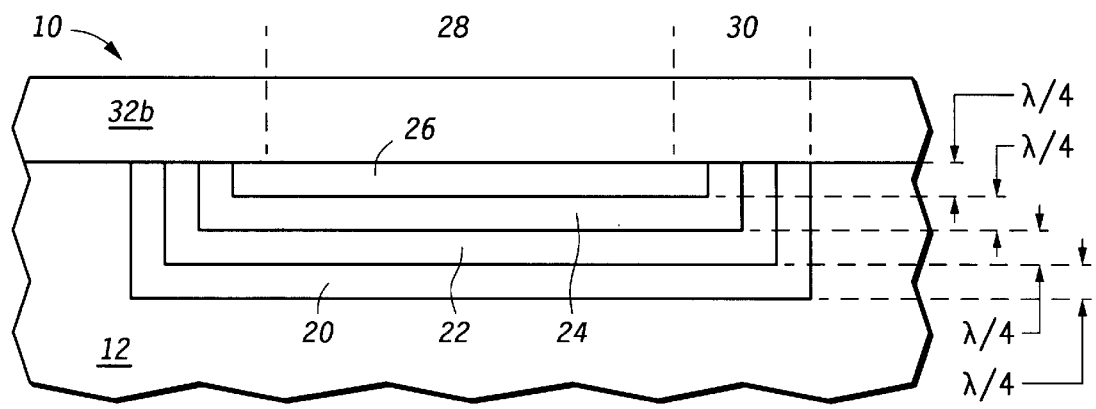

FIG. 6 illustrates that the epitaxial region 32a in FIG. 5 is chemically mechanically polished (CMP) and/or chemically etched (e.g., REB) to result in a planarized or polished semiconductive layer 32b. Layer 32b will also contain an active area 28 and a peripheral area 30 whereby the active area 28 may support photoelectronic devices with improved quantum efficiency while the region 30 will support non photo electronic devices and interconnects or photodevices that do not need improved quantum efficiency. Typical devices formed within the portion 28 of layer 32b are photo transistors, photo diodes, light emitting diodes, optocoupling devices, optical interconnect circuitry, and like optoelectronic structures. Devices which may be formed in all other regions of the layer 32b that are not overlying a mirror region may include bipolar devices, diodes, power transistors, micromechanical devices, MOS transistors (e.g., PMOS, NMOS, CMOS, etc.), JFETs, logic gates, analog circuitry, memory cells, and any other electronic devices.

The presence of the mirror layers 20–26 under the region 28 is advantageous since any device manufactured within the region 28 that functions based on energy exposure or energy creation will be improved in efficiency, response time, and/or sensitivity. As an example, the mirror 20–26 can be engineered to reflect 95% of the energy directed towards it whereby a photo detector device formed within the region 28 will be impinged with a 1.95× dose of energy as opposed to the 1× dose that would be received had the mirror not been present in FIG. 6. For a device that generates energy in all directions, the mirror layers 20–26 will allow downward directed energy to be reflected upward whereby the total useful energy output of the device can approach 2× with no added energy dissipation. Therefore, the external quantum efficiency of devices formed in region 28 may be greatly improved by the embedded, selective, underlying mirror.

Figure 7:
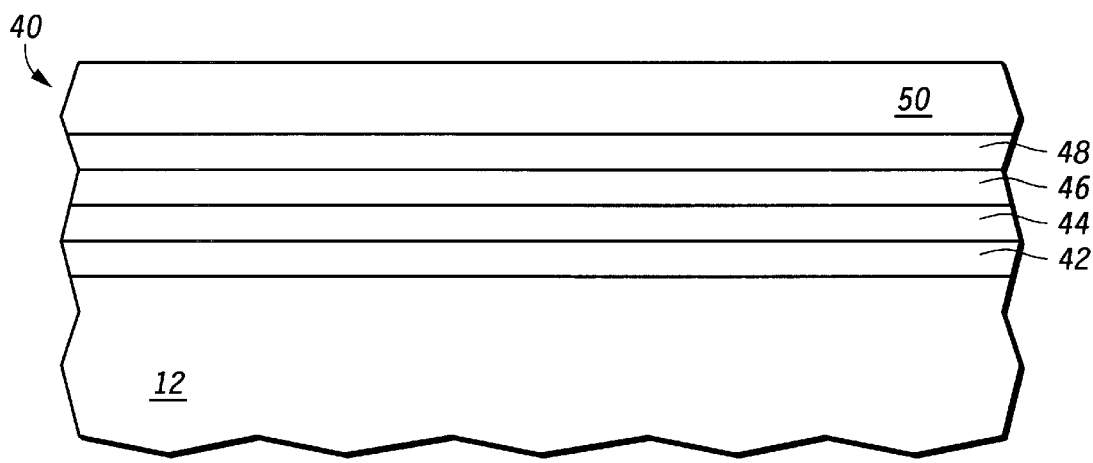
FIG. 7 illustrates, in a cross section diagram, a silicon on insulator (SOI) wafer wherein the insulating layer of the SOI wafer also functions as a dielectric mirror stack underlying a photoelectric IC device.

FIG. 7 illustrates an alternative method for forming a dielectric mirror stack embedded within an IC device. Specifically, FIG. 7 illustrates a silicon on insulator (SOI) wafer 40. The SOI wafer 40 has a substrate 12 analogous to the substrate 12 illustrated in FIGS. 1–6. The substrate 12 of FIG. 7 may be dielectric (e.g., sapphire) or semiconductive (e.g., silicon). Over the substrate 12 are formed continuous and conformal dielectric and/or semiconductive interleaved layers 42–48 where the layers 42–48 are analogous to the layers 20–26 of FIG. 3. It is important to note that while FIG. 7 and FIGS. 3–6 specifically illustrate four layers being used to form the dielectric mirror stack, that any (preferably even) number of layers such as 2, 3, 5, 10, 30 or more layers may be used to form the dielectric mirror stacks taught herein.

After the layers 42–48 in FIG. 7 are contiguously and conformally formed over the entire substrate 12, a wafer bonding operation, confined lateral selective epitaxial growth (CLSEG), or epitaxial growth is used to form a single-crystalline silicon layer 50 over the layer 48 whereby the layer 50 is substantially defect free. Alternatively, the layer 50 may be made of any semiconductor materials such as those discussed above with respect to substrate 12 in FIG. 1. It is important to note that wafer bonding techniques may be used in place of epitaxial growth and polishing procedures in FIGS. 5 and 6 whereby the layer 32b of FIG. 6 may also be formed by a wafer bonding process as taught in this FIG. 7. In summary, FIG. 7 illustrates an SOI wafer where the contiguous dielectric mirror stack 42–48 will provide reflective properties for overlying photodevices as well as SOI isolation for all overlying active devices, whereas FIG. 6 will be wafer that selectively provides reflecting mirror areas and/or SOI ability only in the areas 28.

It is important to note that the layer 50 of FIG. 7 and the layer 32b of FIG. 6 may also be formed by a polysilicon deposition process followed by a thermal or laser recrystalization process in another embodiment. Furthermore, if epitaxial growth is utilized in any one of the embodiments taught herein, confined lateral selective epitaxial growth (CLSEG) may be utilized to form any epitaxial region taught herein. By using an SOI device as shown in FIG. 7 advantageous reflective properties may be obtained for optodevices while all the conventional low power and high speed advantages of SOI wafers are also obtained for logic components.

FIGS. 8–13 illustrate another embodiment which may be used to manufacture a device similar to that illustrated in FIG. 6 where the formation of an opening 18 in the substrate 12 is not necessary, the formation of nonoptimal regions 30 is avoided, and whereby significant vertical and horizontal epitaxial growth is still avoided over the prior art. By avoiding a lengthy epitaxial vertical and horizontal growth path, the device of FIGS. 8–13 is greatly improved in silicon defectivity and facet avoidance than the prior art techniques.

Figure 8:
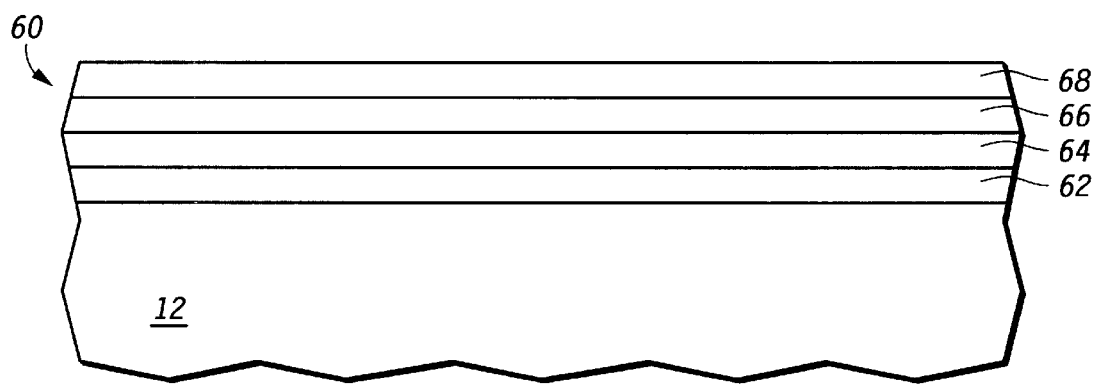
FIGS. 8–13 illustrate, in cross sectional diagrams, yet another method for manufacturing a dielectric reflective mirror under semiconductive material.

Specifically, FIG. 8 illustrates a semiconductor device 60. Semiconductor device 60 contains a substrate 12 similar to the substrates previously discussed herein. Dielectric mirror layers 62–68, which are analogous to one or more of layers 42–48 and 20–26 previously discussed, are formed over the substrate 12 in FIG. 8.

Figure 9:
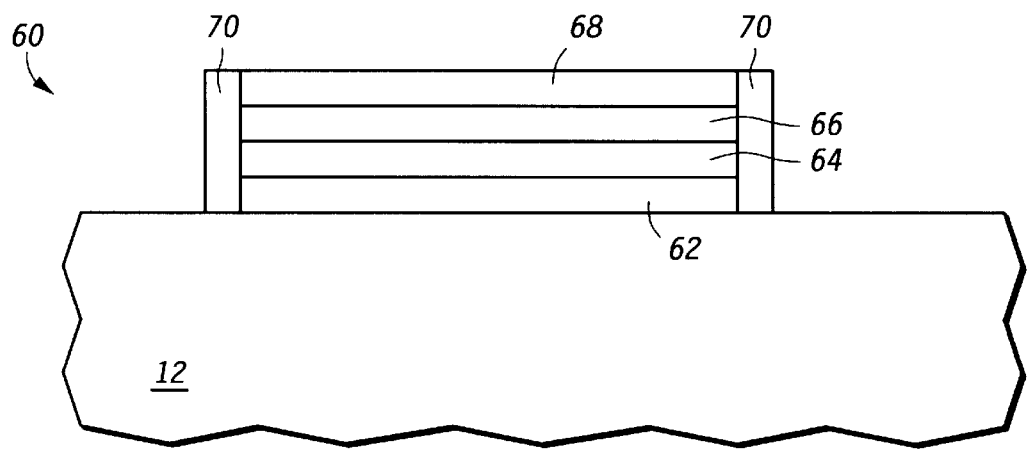

FIG. 9 illustrates that a photolithographic deposition, exposure, patterning, and etch process is used to form the dielectric mirror stack 62–68 illustrated in FIG. 9. One or a plurality of laterally separated dielectric mirror stacks may be formed over the surface of the substrate 12. Each of these dielectric mirror stacks 62–68 has a sidewall and a top surface. A conformal dielectric layer (not specifically shown in FIG. 9) is then deposited over a top of the dielectric mirror stack 62–68, along a sidewall of the dielectric mirror stack 62–68, and along the exposed top surfaces of the substrate 12. This layer is then exposed to a reactive ion etch (RIE) or like directional plasma etch to form sidewall spacer 70 as illustrated in FIG. 9. In one embodiment, the layer 62 and layer 66 could be doped oxides (e.g., BPSG) or a metal oxide such as tantalum pentoxide or titanium oxide whereas the layers 64 and 68 could be silicon dioxide (e.g., ozone or thermal TEOS). In this embodiment, the sidewall spacer 70 is preferably formed as a silicon nitride layer.

Generally, in FIG. 9, the layers 62–68 may comprise any material that is not a seed layer for subsequent epitaxial growth (if epitaxial growth is used) and that provides proper Bragg reflection properties. The sidewall spacer 70 is any material which can be etched selective to the layers 62–68 and the substrate 12.

Figure 10:
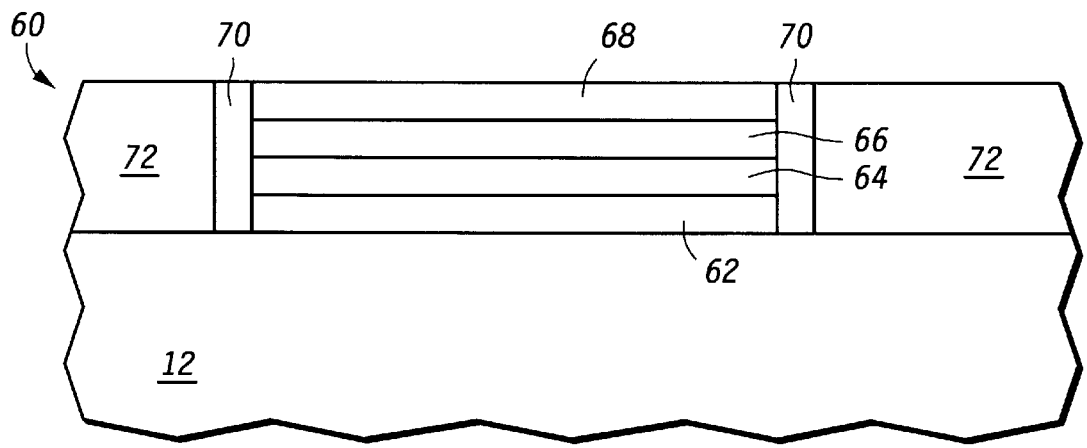

In FIG. 10, a thick polysilicon, amorphous silicon, or like semiconductive layer is deposited over exposed portions of the substrate 12, the spacers 70, and the dielectric stack 62–68. A chemical mechanical polishing (CMP) process which stops on the layer 68 and/or the spacers 70 is performed. Preferably, so that the thickness of the layer 68 is not optically affected, a timed polish process is used followed by a chemical polysilicon etch which is highly selective to the layer 70 and 68, whereby the polished polysilicon region 72 illustrated in FIG. 10 is formed around a peripheral region of the mirror layers 62–68.

Figure 11:
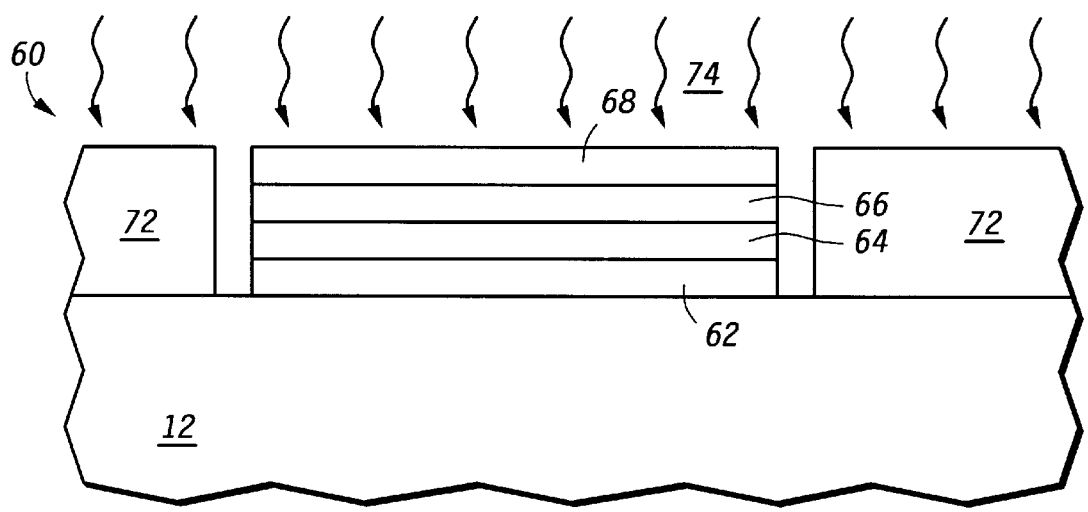

FIG. 11 illustrates that a hot phosphoric etch or a like spacer wet etch and/or RIE etch process is used to remove the spacer 70 selective to the layer 62–68, the substrate 12, and the polished layer 72. This etch process creates a gap between the stack dielectric 62–68 and the polished polysilicon layer 72 as illustrated in FIG. 11. The gap may be as thin as a few hundred angstroms. The removal of the cylindrical nitride spacers 70 around layer 74 results in the polysilicon layers 72 being free standing structures which contact only the underlying silicon single-crystalline substrate 12. Therefore, a thermal process 74 or other exposure to energy may be used to recrystalize the entire volume of the polysilicon layer 72 to form a high quality low silicon defectivity layer 72 in FIG. 11. Optionally, top sharp corners of the layer 72 adjacent the gap can be rounded by a wet polysilicon etch following (or prior to) the thermal processing of layer 74 of FIG. 11. This rounding of the edges of layer 74 will prevent air gaps or air void formation in the gaps during subsequent epitaxial processing. However, in some cases, voiding will not occur or its prevention is not desired, whereby such corner rounding etch measures are not needed.

Figure 12:
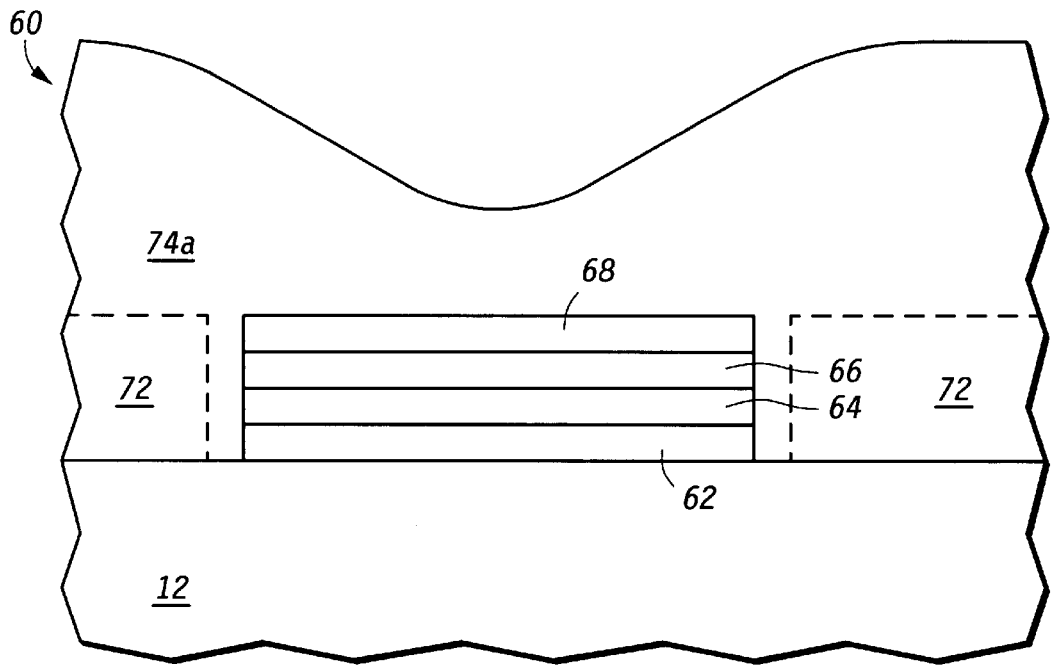

FIG. 12 illustrates that an epitaxial growth process which seeds from the layer 12 exposed within the gap and/or from the layer 72 is performed to form an epitaxial region 74a which is analogous to the epitaxial region 32a in FIG. 5. Therefore, the resulting structure of FIG. 12 looks similar to the structure of FIG. 5 except that the regions 30 have been avoided.

Figure 13:
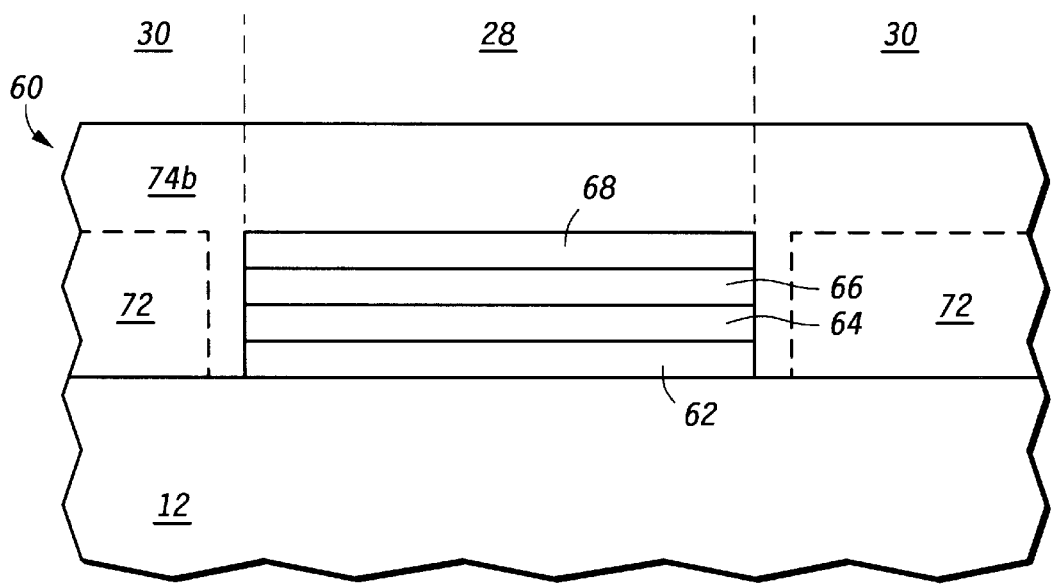

FIG. 13 illustrates that a chemical mechanical polishing (CMP) process and/or an etch back process is used to reduce the layer 74a to a polished planar semiconductive region 74b. It is important to note that a dashed line divides the layer 72 from the layer 74b in FIGS. 12 and 13 for illustrative purposes, however, this dashed line interface is likely not to be detectable in the final product since the materials on both sides of the dashed lines are identical or nearly identical in structure and composition. As was shown previously in FIG. 6, active photodevice area 28 is illustrated in FIG. 13 as well as areas 30 which support nonphotoelectronic devices. Note that in FIG. 13, as opposed to FIG. 6, there is no portion of the mirror layer 62–68 that cannot support reflection for an overlying photodevice. Therefore, the embodiment of FIG. 13 may result in a more efficient usage of mirror surface area than that illustrated in FIG. 6 in some embodiments.

Figure 14:
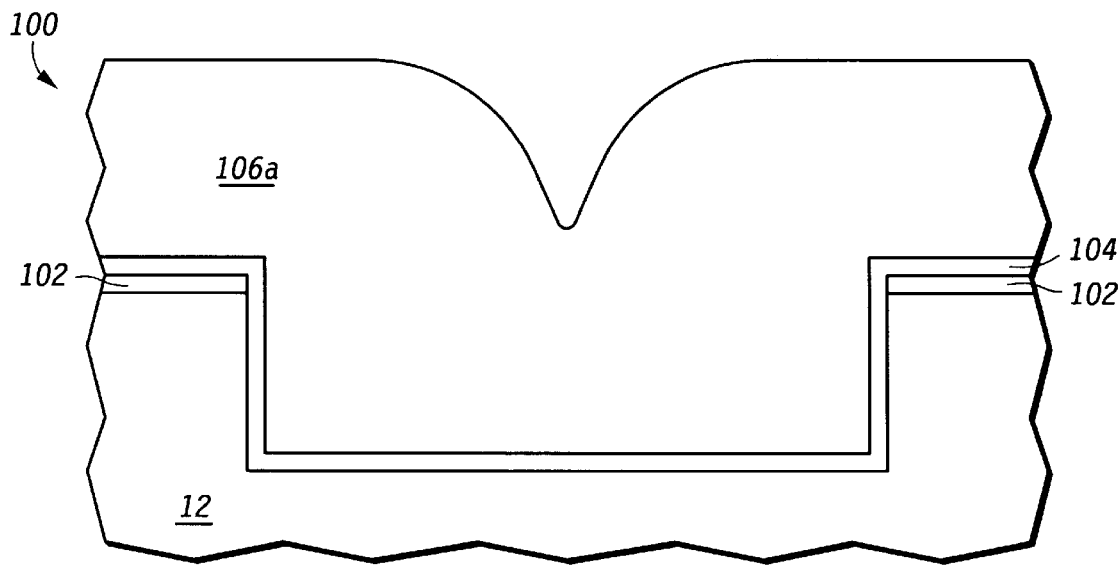
FIGS. 14–16 illustrate, in cross sectional diagrams, a method for forming a composite metallic and dielectric reflective structure under semiconductive material.
Figure 15:
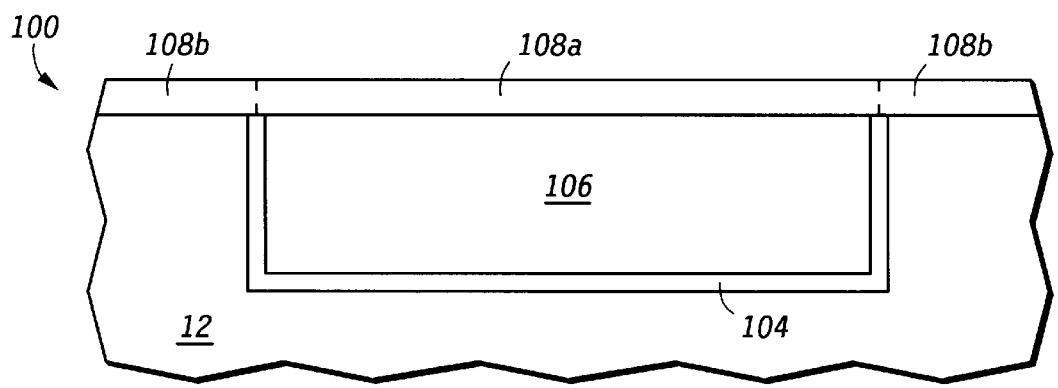
Figure 16:
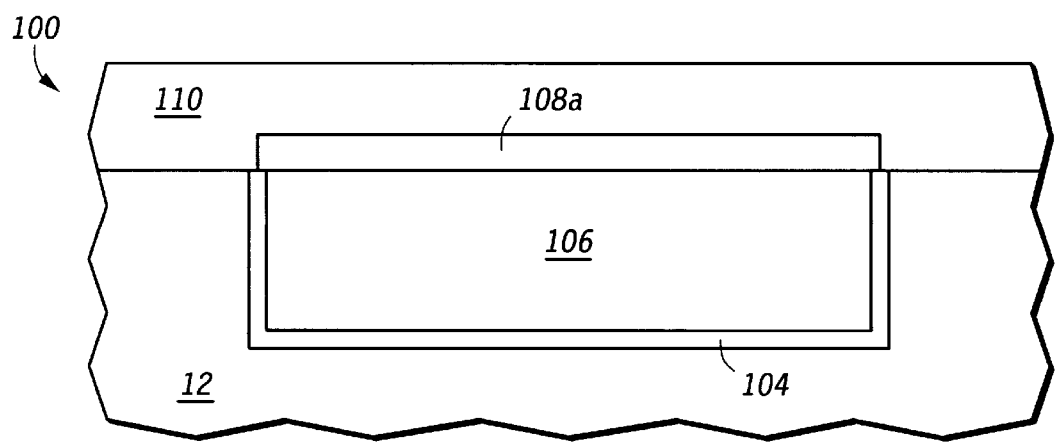

FIGS. 14–16 illustrate an alternate method which may be used to form a buried reflective structure in accordance with the present invention. Specifically, FIG. 14 illustrates a semiconductor device 100 having a substrate 12 similar to the substrate 12 previously discussed herein. A pad oxide 102 in FIG. 14 is similar to the pad oxide 14 previously discussed with respect to FIG. 1. A trench liner layer 104 is deposited along the top surface of the pad oxide 102 and along a sidewall and bottom surface of an opening within the substrate 12. Generally, the trench liner is a silicon dioxide, an oxynitride, like dielectric layer, or composite thereof. FIG. 14 illustrates that a thick metallic layer 106a, such as aluminum, aluminum/silicon, or aluminum/silicon/copper, is deposited to entirely fill the opening in the substrate 12.

FIG. 15 illustrates that a chemical mechanical polish (CMP) and/or an etch back technique is performed in order to planarize the layer 106a such that the trench fill structure 106 is formed within the opening in the substrate. In addition, top portions of the trench liner 104 and top portions of the pad oxide 102 are either removed by chemical etching after CMP operations are complete or are removed by the planarization operation itself. After planarization operations, a thermal oxide process is used to form a metallic oxide 108a from metallic region 106 simultaneously with the formation of a semiconductive oxide 108b from the layer 12. It is important to note that the thermal oxidation process in FIG. 15 may be replaced by a non-self-aligned TEOS deposition and etch capping layer that overlies the region 106 but exposes non-self-aligned portions of the substrate 12. In another form, the layer 102 of the substrate could remain behind on the wafer and be made of an oxidation shield (e.g., layer 102 could incorporate a silicon nitride layer of 100 angstroms or greater thickness). Once this is done, the top surface of the region 106 may be selectively oxidized or, in another form, the layer 106 can be chemically recessed into the opening in the substrate 12 whereby this recess is filled with deposited oxide that is removed from over the substrate 12 by a polishing step. Regardless, some process is used to form an oxide region 108a over the region 106.

FIG. 16 illustrates that a selective chemical etch process can be used to remove the oxide portions 108b while the oxide portions 108a will remain behind (if such regions 108b are even formed by the embodiment selected from above). This removal ensures that the aluminum layer 106 is entirely encapsulated within dielectric material while the substrate 12 is exposed for epitaxial formation in a self-aligned manner. It is important to note that in other embodiments, the aluminum or like metallic material 106 can be in direct contact with one or both of the layer 12 or any overlying semiconductive material. However, it is generally better for stress and reliability of an integrated circuit (IC) that the metallic material 106 be isolated from the substrate 12 and any overlying semiconductive material by the oxide layers 104 and 108a. FIG. 16 then illustrates that the epitaxial, wafer bonding, confined lateral selective epitaxial growth (CLSEG), polysilicon deposition and laser recrystallization, or like processes can then be used to form the planar semiconductive single crystalline layer of material 110 over the reflective structure 106. Therefore, an improved composite metallic and dielectric reflective structure is formed under a semiconductive device layer which can support photoelectric device formation.

Although the invention has been described and illustrated with reference to specific embodiments, it is not intended that the invention be limited to those illustrative embodiments. Those skilled in the art will recognize that modifications and variations may be made without departing from the spirit and scope of the invention. For example, the processes taught herein may be used to form discrete electronic components and not just multi-device integrated circuits (ICs). Therefore, it is intended that this invention encompass all of the variations and modifications as fall within the scope of the appended claims.

What is claimed is:

1. A method for forming a semiconductor device for reflecting electromagnetic radiation having a wavelength X, the method comprising the steps of:

forming an opening in a semiconductor substrate;

depositing at least one reflective layer in the opening;

removing the at least one reflective layer such that the at least one reflective layer is substantially coplanar with the substrate; and forming a semiconductor layer so as to overlie the at least one reflective layer.

2. The method of claim 1, wherein the at least one reflective layer comprises a first pair of reflective layers consisting of a first reflective layer and a second reflective layer, and the first reflective layer has a first index of refraction and the second reflective layer has a second index of refraction.

3. The method of claim 2, wherein at least one of the first reflective layer and the second reflective layer comprises silicon dioxide.

4. The method of claim 3, wherein the other of first reflective layer and the second reflective layer comprises silicon nitride.

5. The method of claim 3, wherein the other of first reflective layer and the second reflective layer comprises polycrystalline silicon.

6. The method of claim 2, wherein the at least one reflective layer comprises additional pairs of reflective layers.

7. The method of claim 2, wherein each of the first and second reflective layers has a thickness $N\lambda/4$, wherein N is an odd integer and $\lambda$ is the wavelength of the electromagnetic radiation.

8. The method of claim 1, wherein the at least one reflective layer comprises a mirror stack comprised of a plurality of reflective layers, the mirror stack having an active area over which an active device is formed in the monocrystalline silicon layer, and a peripheral area.

9. The method of claim 8, wherein each of the plurality of reflective layers is exposed along a top surface of the peripheral area.

10. The method of claim 1, wherein a photodetector is formed in the monocrystalline silicon layer so as to overlie the at least one reflective layer.

11. The method of claim 1, wherein the at least one reflective layer comprises a metallic layer.

12. The method of claim 11, further comprising a step of providing a dielectric layer so as to overlie at least the metallic layer.

13. The method of claim 12, wherein the dielectric layer is formed by oxidizing at least a portion of the metallic layer.

14. The method of claim 12, wherein another dielectric layer is formed underlying the metallic layer.

15. The method of claim 11, wherein the metallic layer comprises aluminum.

16. A method for forming a semiconductor device for reflecting electromagnetic radiation having wavelength $\lambda$, the method comprising the steps of:

forming an opening in a semiconductor substrate;

depositing at least two reflective layers including a first reflective layer and a second reflective layer in the opening, the first reflective layer having a first index of refraction and the second reflective layer having a second index of refraction, wherein the first index of refraction is different from the second index of refraction;

polishing portions of the at least two reflective layers such that the at least two reflective layer are substantially coplanar with the substrate;

forming a single-crystalline silicon layer so as to overlie the at least one reflective layer; and forming a photo device on a portion of the single-crystalline silicon layer overlying the at least two reflective layers.

17. A method for forming a semiconductor device for reflecting electromagnetic radiation having wavelength X, the method comprising the steps of:

forming at least one reflective layer on a semiconductor substrate, the at least one reflective layer having sidewalls defining an outer periphery of the at least one reflective layer;

forming sidewall spacers along the outer periphery of the at least one reflective layer; and forming a semiconductive layer on the semiconductor substrate so as to surround the sidewalls of the at least one reflective layer;

removing the sidewall spacers;

processing the semiconductive layer to form an improved semiconductive layer; and growing semiconductive material from the improved semiconductive layer so as to overlie the at least one reflective layer.

18. The method of claim 17, wherein the at least one reflective layer comprises a stack of reflective layers, alternating reflective layers in the stack having different indices of refraction.

19. The method of claim 18, wherein the alternating reflective layers comprises silicon oxide and at least one material from the group consisting of silicon nitride and polysilicon.

20. The method of claim 17, wherein removal of the sidewall spacers leaves behind gaps between the at least one reflective layer and the semiconductive layer, where the growth of semiconductive material substantially fills the gaps.

21. A method for forming a semiconductor device for reflecting electromagnetic radiation having a wavelength X, the method comprising the steps of:

depositing a stack of reflective layers on a substrate wafer, wherein alternating layers of the stack have different indices of refraction; and forming a semiconductor material to the substrate wafer, such that the stack of reflective layers lies between the substrate wafer and the semiconductor material to form a silicon on insulator wafer that has a reflective buried insulator layer comprised of the stack of reflective layers.

22. The method of claim 21 wherein the step of forming is performed by bonding a semiconductor substrate material to the substrate wafer.

* * * * *

UNITED STATES PATENT AND TRADEMARK OFFICE
CERTIFICATE OF CORRECTION

PATENT NO. : 6,150,190
DATED : November 21, 2000
INVENTOR(S) : John J. Stankus et al.

It is certified that error appears in the above-identified patent and that said Letters Patent is hereby corrected as shown below:

Column 10, claim 1,
Line 10, change "X" to -- $\lambda$ --

Column 11, claim 17,
Line 17, change "X" to -- $\lambda$ --

Column 12, claim 21,
Line 17, change "X" to -- $\lambda$ --

Signed and Sealed this

Fourth Day of December, 2001

*Attest:*

NICHOLAS P. GODICI
*Attesting Officer*     Acting Director of the United States Patent and Trademark Office